(12) United States Patent
Lee

(10) Patent No.: US 11,114,403 B2
(45) Date of Patent: Sep. 7, 2021

(54) SEMICONDUCTOR DEVICE AND METHOD OF MANUFACTURING SEMICONDUCTOR DEVICE

(71) Applicant: SK hynix Inc., Icheon-si (KR)

(72) Inventor: Nam Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/848,446

(22) Filed: Apr. 14, 2020

(65) Prior Publication Data

US 2021/0134753 A1    May 6, 2021

(30) Foreign Application Priority Data

Nov. 6, 2019  (KR) .......................... 10-2019-0140874

(51) Int. Cl.
    *H01L 25/065*  (2006.01)
    *H01L 23/00*   (2006.01)

(52) U.S. Cl.
    CPC .......... *H01L 24/20* (2013.01); *H01L 25/0657* (2013.01); *H01L 2225/06541* (2013.01); *H01L 2924/1434* (2013.01)

(58) Field of Classification Search
    CPC ................ H01L 24/20; H01L 25/0657; H01L 2225/06541; H01L 2924/1434
    See application file for complete search history.

(56) References Cited

U.S. PATENT DOCUMENTS

| 2017/0358553 | A1* | 12/2017 | Kim ........................ H01L 24/08 |
| 2018/0277497 | A1* | 9/2018 | Matsuo .................... H01L 25/18 |
| 2020/0091170 | A1* | 3/2020 | Baek ................. H01L 27/11582 |

FOREIGN PATENT DOCUMENTS

| KR | 100618837 B1 | 9/2006 |
| KR | 1020140080218 A | 6/2014 |
| KR | 101975541 B1 | 5/2019 |

* cited by examiner

*Primary Examiner* — Timor Karimy

(74) *Attorney, Agent, or Firm* — William Park & Associates Ltd.

(57) ABSTRACT

A semiconductor device includes a first chip including a first substrate, a first cell array, a first metal wire, and a first bonding structure, wherein the first bonding structure includes a first through portion that passes through the first metal wire and a first bonding portion that is formed in the first substrate, and a second chip, bonded to the first chip, including a second substrate, a second cell array, a second metal wire, and a second bonding structure, wherein the second bonding structure includes a second through portion that passes through the second metal wire and a second bonding portion that is formed in the second substrate, and bonded to the first chip. The first bonding portion of the first chip is configured to be bonded to the second through portion of the second chip.

20 Claims, 18 Drawing Sheets

SEMICONDUCTOR DEVICE AND METHOD OF MANUFACTURING SEMICONDUCTOR DEVICE

CROSS-REFERENCE TO RELATED APPLICATION

The present application claims priority under 35 U.S.C. § 119(a) to Korean patent application number 10-2019-0140874, filed on Nov. 6, 2019, in the Korean Intellectual Property Office, the entire disclosure of which is incorporated herein by reference.

BACKGROUND

1. Technical Field

The present disclosure relates to an electronic device, and more particularly, to a semiconductor device and a method of manufacturing the semiconductor device.

2. Related Art

A non-volatile memory element is a memory element that retains stored data regardless of whether power is on or off. Increasing the integration density of two-dimensional non-volatile memory devices, forming memory cells in a single layer over a substrate, has been difficult. Thus, three-dimensional non-volatile memory devices have been proposed in which memory cells are stacked in a vertical direction over a substrate.

The three-dimensional non-volatile memory element includes interlayer insulating films and gate electrodes that are stacked in an alternating manner. The three-dimensional non-volatile memory element also includes channel films that pass through the interlayer insulating films and the gate electrodes and memory cells that are stacked along the channel films. Various structures and manufacturing methods have been developed to improve operation reliability of the non-volatile memory element that has such a three-dimensional structure.

SUMMARY

A semiconductor device according to an embodiment of the present disclosure may include a first chip including a first substrate, a first cell array, a first metal wire, and a first bonding structure, wherein the first bonding structure includes a first through portion that passes through the first metal wire and a first bonding portion that is formed in the first substrate, and a second chip, bonded to the first chip, including a second substrate, a second cell array, a second metal wire, and a second bonding structure, wherein the second bonding structure includes a second through portion that passes through the second metal wire and a second bonding portion that is formed in the second substrate. The first bonding portion of the first chip is configured to be bonded to the second through portion of the second chip.

A semiconductor device according to an embodiment of the present disclosure may include a first chip including a first substrate, a first metal wire, a first bonding structure, and a first interlayer insulating film, wherein the first metal wire and the first interlayer insulating film are formed on a front surface of the first substrate, and the first bonding structure includes a first through portion that passes through the first metal wire and a first bonding portion that is formed in the first substrate and exposed to an exterior of the first chip through a rear surface of the first substrate, and a second chip, bonded to the first chip, including a second substrate, a second metal wire, a second bonding structure, and a second interlayer insulating film, wherein the second metal wire and the second interlayer insulating film are formed on a front surface of the second substrate, and the second bonding structure includes a second through portion that passes through the second metal wire and a second bonding portion that is formed in the second substrate and exposed to an exterior of the second chip through a rear surface of the second substrate. The rear surface of the first substrate and the second interlayer insulating film are bonded to each other at a bonding interface between the first chip and the second chip. The first bonding portion may be bonded to the second through portion.

A method of manufacturing a semiconductor device according to an embodiment of the present disclosure may include forming a first cell array on a front surface of a first substrate, forming a first metal wire on the front surface of the first substrate, forming a first interlayer insulating film on the first metal wire, forming a first opening that passes through the first interlayer insulating film and the first metal wire to expose the front surface of the first substrate, forming a second opening connected to the first opening, wherein the second opening is formed in the first substrate, forming a first bonding structure including a first through portion in the first opening and a first bonding portion in the second opening, and exposing the first bonding structure through a rear surface of the first substrate.

A method of manufacturing a semiconductor device according to an embodiment of the present disclosure may include forming a first chip including a first substrate, a first cell array, a first metal wire, and a first bonding structure, wherein the first bonding structure includes a first through portion that passes through the first metal wire and a first bonding portion that is formed in the first substrate, forming a second chip, bonded to the first chip, including a second substrate, a second cell array, a second metal wire, and a second bonding structure, wherein the second bonding structure includes a second through portion that passes through the second metal wire and a second bonding portion that is formed in the second substrate, and bonding the first chip to the second chip to bond the first bonding portion of the first chip to the second through portion of the second chip.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

An embodiment of the present disclosure provides a semiconductor device and a method of manufacturing the semiconductor device having a stable structure and an improved characteristic.

A semiconductor device having a stable structure and improved reliability may be provided. In addition, in manufacturing a semiconductor device, difficulty of a process may be reduced, a procedure may be simplified, and the cost may be reduced.

Figure 1A:
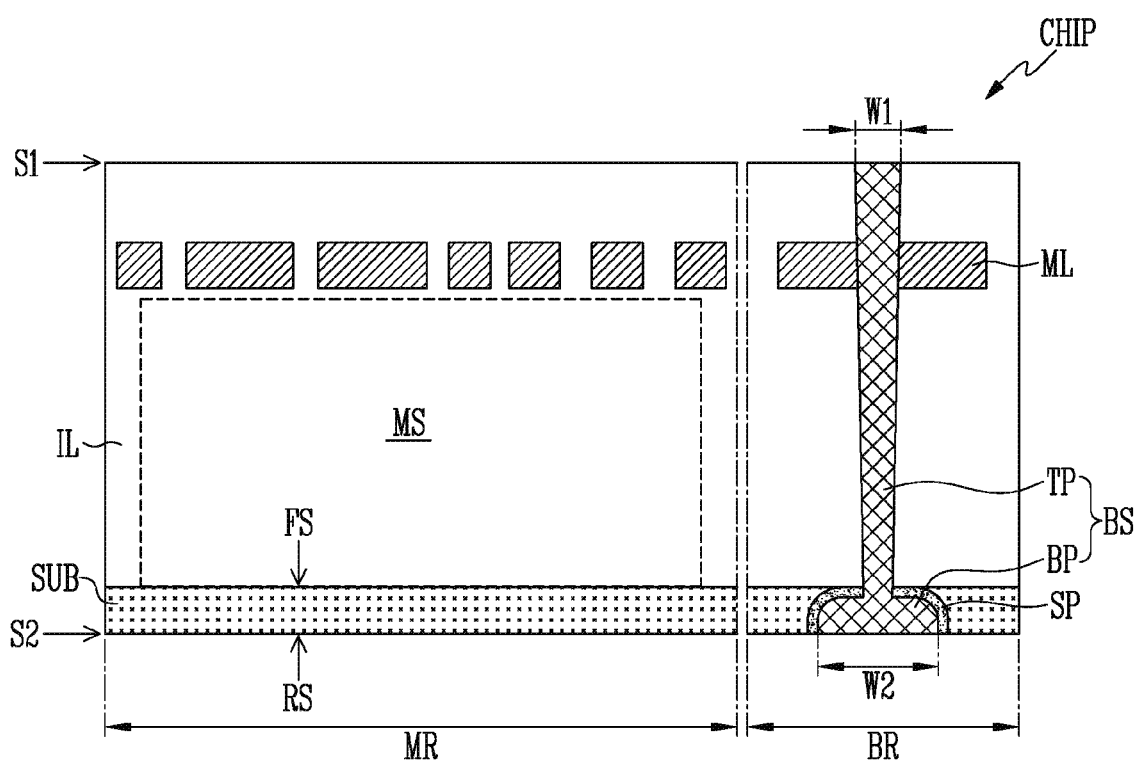
FIGS. 1A to 1C are cross-sectional views, illustrating a structure of a semiconductor device, according to an embodiment of the present disclosure.
Figure 1B:
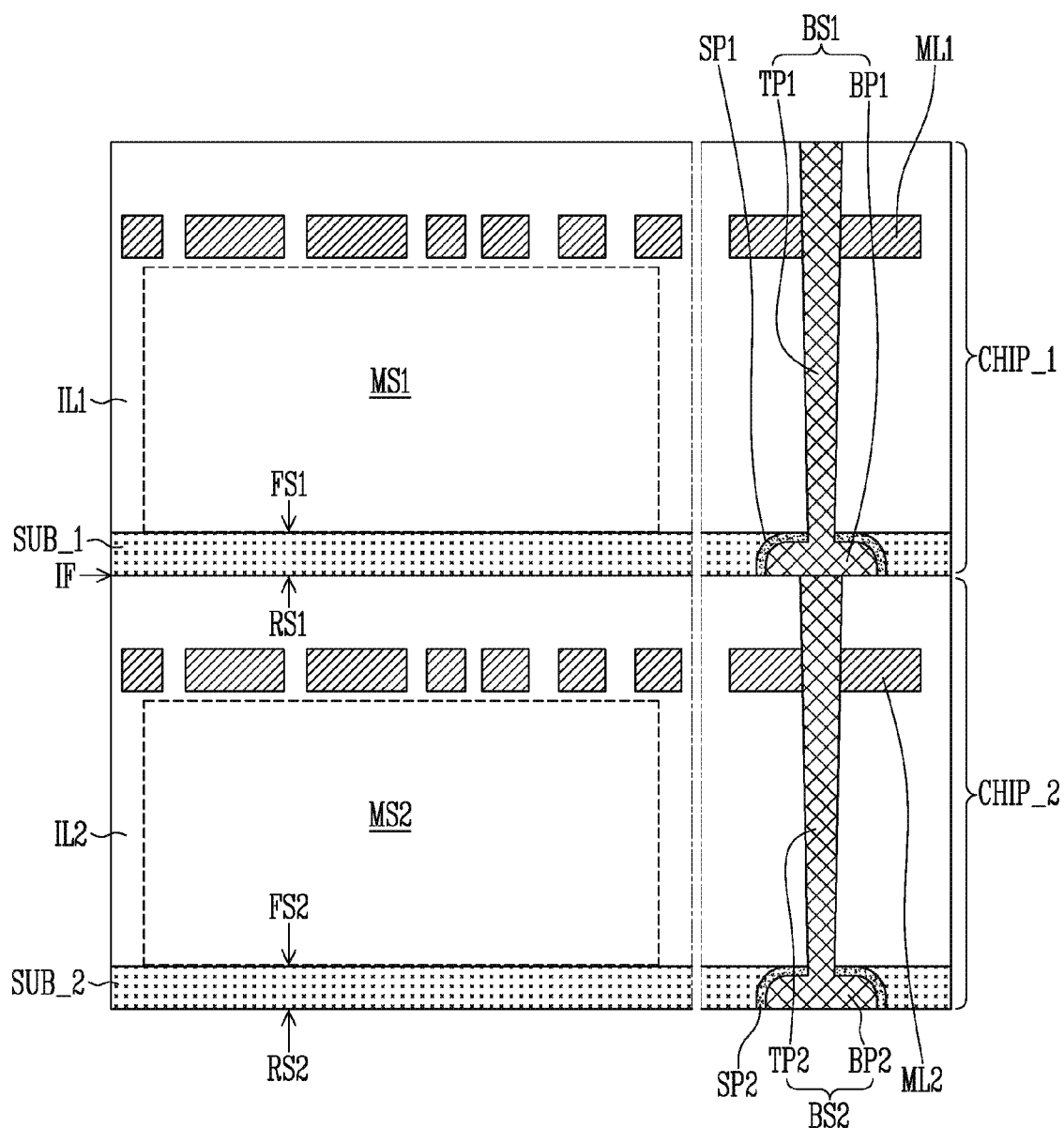
Figure 1C:
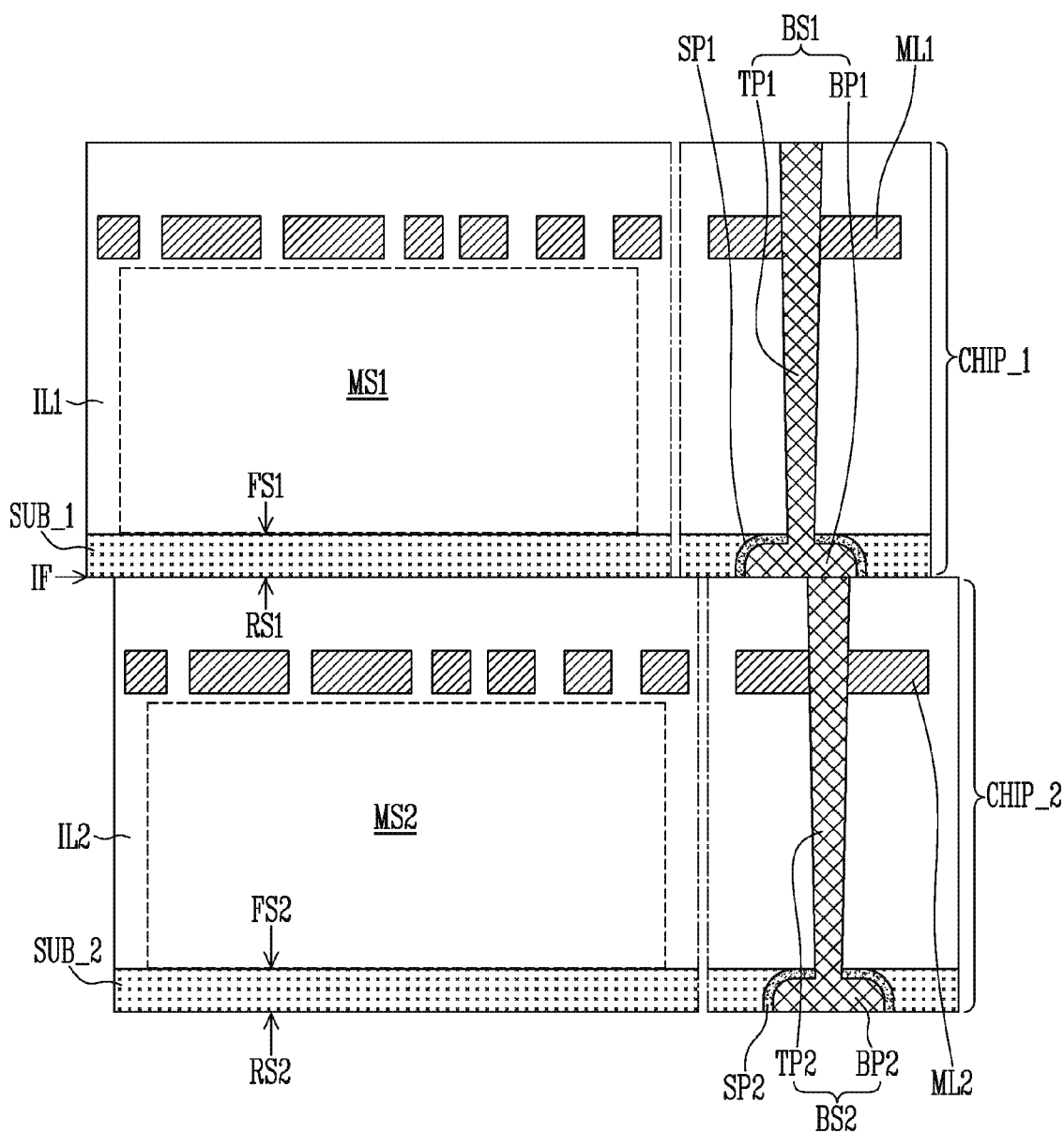

FIGS. 1A to 1C are cross-sectional views, illustrating a structure of a semiconductor device, according to an embodiment of the present disclosure.

Referring to FIG. 1A, the semiconductor device may include a chip CHIP. The chip CHIP may include a substrate SUB, a metal wire ML, and a bonding structure BS. In addition, the chip CHIP may further include at least one of a main structure MS, an interlayer insulating film IL, and an insulating spacer SP.

The chip CHIP may include a main region MR and a bonding pad region BR. The main structure MS may be positioned in the main region MR, and the bonding structure BS may be positioned in the bonding pad region BR. The metal wire ML and the interlayer insulating film IL may be positioned in the main region MR and the bonding pad region BR.

The substrate SUB may be a semiconductor substrate. The substrate SUB may include a front surface FS and a rear surface RS, the rear surface RS being on the opposite side of the front surface FS. The main structure MS and the interlayer insulating film IL may be formed on the front surface FS of the substrate SUB. The interlayer insulating film IL may be a single film or a multilayer film. The interlayer insulating film IL may include an insulating material, such as an oxide or a nitride. The main structure MS and the metal wire ML may be formed in the interlayer insulating film IL.

The main structure MS may include a cell array, a peripheral circuit, or a combination thereof. In addition, the main structure MS may further include an interconnection structure that is electrically connected to the cell array or the peripheral circuit. The interconnection structure may include a contact plug, a wire, and the like.

The cell array may include memory cells that are stacked on the substrate SUB. For example, the cell array includes a memory string that is connected between a bit line and a source line. The memory string may include at least one drain select transistor, a plurality of memory cells, and at least one source select transistor, all connected in series. Alternatively, the memory string may include at least one drain select transistor, a plurality of drain side memory cells, at least one pipe transistor, a plurality of source side memory cells, and at least one source select transistor, all connected in series. The peripheral circuit is for driving the memory string and may include a transistor, a capacitor, a resistor, an inductor, an amplifier, a logic circuit, and the like.

Based on the type, function, and other characteristics of the main structure MS that is included in the chip CHIP, the chip CHIP may be a cell chip, a peripheral circuit chip, a memory chip, or the like. When the main structure MS includes a cell array, the chip CHIP may be the cell chip. When the main structure MS includes a peripheral circuit, the chip CHIP may be the peripheral circuit chip. When the main structure MS includes both cell array and peripheral circuits, the chip CHIP may be the memory chip. In addition, a plurality of chips CHIP may be bonded to each other.

The bonding structure BS may bond the chips CHIP and provide an electrical connection between the chips CHIP. The bonding structure BS may pass through the chip CHIP by passing through the interlayer insulating film IL and the substrate SUB.

The bonding structure BS may include a through portion TP and a bonding portion BP. The through portion TP may pass through the interlayer insulating film IL and may pass through the metal wire ML. The through portion TP may be electrically connected to the metal wire ML. The bonding portion BP may be formed in the substrate SUB, and may be exposed to the exterior of the chip CHIP through the rear surface RS of the substrate SUB.

The chip CHIP may include a first surface S1 and a second surface S2, the second surface being on the opposite side of the first surface S1. Here, the first surface S1 may be an upper surface of the chip CHIP, and the second surface S2 may be a lower surface of the chip CHIP. However, the upper surface and the lower surface are relative terms, and the first surface S1 may be the lower surface and the second surface S2 may be the upper surface based on perspective. The through portion TP may be exposed to the exterior of the chip CHIP through the first surface S1 of the chip CHIP, and the bonding portion BP may be exposed to the exterior of the chip CHIP through the second surface S2 of the chip CHIP.

The bonding portion BP may have a rounded sidewall. The sidewall of the bonding portion BP may have a curvature. The bonding portion BP may have an upper surface adjacent to the front surface FS, a lower surface coplanar with the rear surface RS and the sidewall coupling the upper surface and the lower surface. The bonding portion BP may have a rounded corner where the upper surface and the sidewall converge, in the cross-sectional view. The bonding portion BP may have a rounded corner where the front surface FS of the substrate SUB and the sidewall of the bonding portion BP converge. In addition, the insulating spacer SP may be interposed between the bonding portion BP and the substrate SUB. The insulating spacer SP may include an insulating material such as an oxide or a nitride. The bonding portion BP and the substrate SUB may be insulated from each other through the insulating spacer SP.

The through portion TP and the bonding portion BP may have substantially the same width or may have different widths. The bonding portion BP may have a width that is wider than a width of the through portion TP. The through portion TP may have a first width W1 at the first surface S1, and the bonding portion BP may have a second width W2 at the second surface S2. The second width W2 may be substantially the same as the first width W1 or may be wider than the first width W1.

The bonding structure BS may be a single film or a multilayer film. The through portion TP and the bonding portion BP may be an integrally connected single film. The bonding structure BS may include a conductive material, and may include a metal such as copper.

Referring to FIGS. 1B and 1C, the semiconductor device may include a first chip CHIP_1 and a second chip CHIP_2. The second chip CHIP_2 may be bonded to the first chip CHIP_1, and a bonding interface IF may exist between the first chip CHIP_1 and the second chip CHIP_2.

The first chip CHIP_1 may include a first substrate SUB_1, a first metal wire ML1, a first bonding structure BS1, a first main structure MS1, a first interlayer insulating film IL1, and the first insulating spacer SP1. The first bonding structure BS1. may include a first through portion TP1 and a first bonding portion BP1. The first substrate SUB1 may include a first front surface FS1 and a first rear surface RS1. The first bonding portion BP1 may be exposed to the exterior of the first chip CHIP_1 from the first rear surface RS1 of the first substrate SUB_1.

The second chip CHIP_2 may include a second substrate SUB_2, a second metal wire ML2, a second bonding structure BS2, a second main structure MS2, a second interlayer insulating film IL2, and a second insulating spacer SP2. The second bonding structure BS2 may include a second through portion TP2 and a second bonding portion BP2. The second substrate SUB2 may include a second front surface FS2 and a second rear surface RS2. The second bonding portion BP2 may be exposed to the exterior of the second chip CHIP_2 from the second rear surface RS2 of the second substrate SUB_2.

The first substrate SUB1 may be positioned between the first main structure MS1 and the second main structure MS2. The second main structure MS2 may be positioned between the first substrate SUB_1 and the second substrate SUB_2. The second metal wire ML2 may be positioned between the first substrate SUB_1 and the second substrate SUB_2. For reference, FIG. 1B shows a structure in which the first chip CHIP_1 is positioned on the second chip CHIP_2. However, the second chip CHIP_2 may be positioned on the first chip CHIP_1.

The first bonding portion BP1 and the second through portion TP2 may be bonded to each other at the bonding interface IF. The first bonding portion BP1 and the second through portion TP2 may directly come in contact with each other and may be electrically connected to each other. In addition, the first rear surface RS1 of the first substrate SUB1 and the second interlayer insulating film IL2 may be bonded to each other at the bonding interface IF. For example, the first rear surface RS1 of the first substrate SUB1 and the second interlayer insulating film IL2 may be bonded to each other by the Van der Waals force.

A structure in the first chip CHIP_1 and a structure in the second chip CHIP_2 may be positioned to correspond to each other. Based on the bonding interface IF, the first main structure MS1 and the second main structure MS2 may be aligned with each other and may be arranged up and down. Based on the bonding interface IF, the first bonding structure BS1 and the second bonding structure BS2 may also be positioned to aligned with each other and may be arranged up and down. Referring to FIG. 1B, the first bonding structure BS1 and the second bonding structure BS2 may be arranged so that the centers of the first bonding structure BS1 and the second bonding structure BS2 are aligned.

Referring to FIG. 1C, the first chip CHIP_1 and the second chip CHIP_2 may be misaligned, and the first bonding structure BS1 and the second bonding structure BS2 may be arranged so that the centers of the first bonding structure BS1 and the second bonding structure BS2 may be misaligned. Since the first bonding portion BP1 is wider than the second through portion TP2, the first chip CHIP_1 and the second chip CHIP_2 may still be electrically connected to each other even though the first chip CHIP_1 and the second chip CHIP_2 are misaligned.

According to the structure described above, the bonding portions BP1 and BP2 are formed in the first substrate SUB1 and the second substrate SUB2, respectively. In addition, the first chip CHIP_1 and the second chip CHIP_2 may be electrically connected to each other using the first bonding structure BS1 and the second bonding structure BS2. Therefore, since an additional structure, such as a bump or a non-conductive film (NCF), is not interposed between the first chip CHIP_1 and the second chip CHIP_2, the height of the package may be reduced.

Since the width of the first bonding portion BP1 is wider than the width of the second through portion TP2 at the bonding interface IF, the margin of error for alignment may be increased. In addition, since the disposition of the power line is free in disposing wires, the speed of the semiconductor device may be improved.

FIGS. 2A to 2D are diagrams, illustrating the structure of the semiconductor device, according to an embodiment of the present disclosure.

Figure 2A:
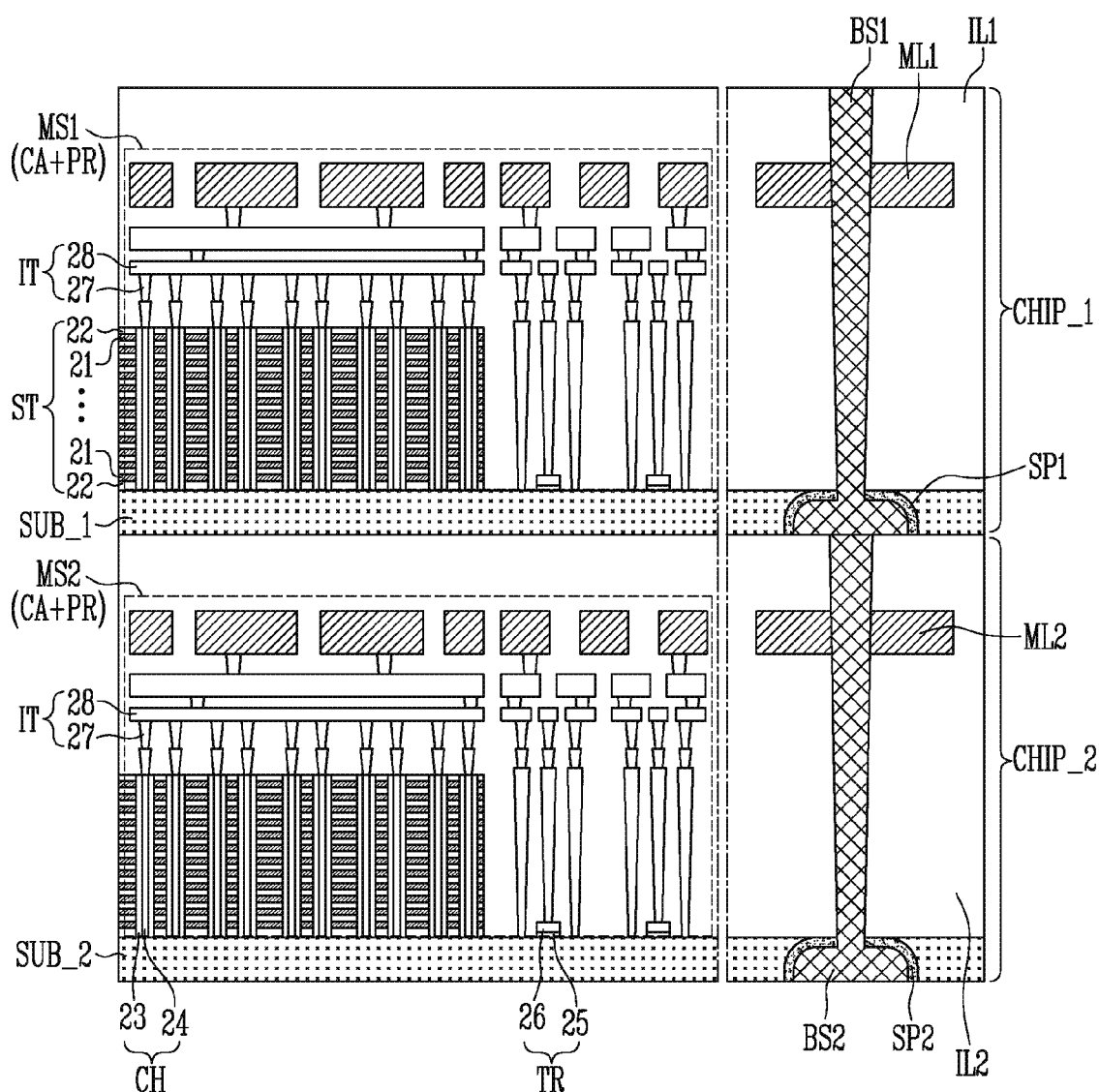
FIGS. 2A to 2D are diagrams, illustrating the structure of the semiconductor device, according to an embodiment of the present disclosure.

Referring to FIG. 2A, a first chip CHIP_1 may include a first substrate SUB_1, a first metal wire ML1, and a first bonding structure BS1. In addition, the first chip CHIP_1 may further include at least one of a first main structure MS1, a first interlayer insulating film IL1, and a first insulating spacer SP1.

The first main structure MS1 may include a cell array CA and a peripheral circuit PR. The cell array CA may include a stack ST and a channel structure CH. The stack ST may include conductive films 21 and insulating films 22 that are stacked in an alternating manner. The channel structure CH may include a channel film 24 that passes through the stack ST and a memory film 23 that is interposed between the channel film 24 and the conductive films 21. The memory film 23 may further include at least one of a charge blocking film, a data storage film, and a tunnel insulating film. The channel film 24 may have a tube-like structure, and a gap fill insulating film (not shown) may be formed inside the channel film 24. The peripheral circuit PR may include a transistor TR, and the transistor TR may include a gate electrode 26 and a gate insulating film 25. The peripheral circuit PR may be positioned at the same level as the cell array or may be positioned at a level different from that of the cell array.

In addition, the first main structure MS1 may further include an interconnection structure IT that is connected to the cell array CA or the peripheral circuit PR. The interconnection structure IT may include a contact plug 27, a wire 28, and the like.

A second chip CHIP_2 may include a second substrate SUB_2, a second metal wire ML2, and a second bonding structure BS2. In addition, the second chip CHIP_2 may further include at least one of a second main structure MS2, a second interlayer insulating film IL2, and a second insulating spacer SP2.

The second main structure MS2 may include a cell array CA and a peripheral circuit PR. In addition, the second main structure MS2 may further include an interconnection structure IT that is connected to the cell array CA or the peripheral circuit PR. Since a detailed configuration of the second main structure MS2 is similar to that of the first main structure MS1, repetitive description thereof will be omitted.

Figure 2B:
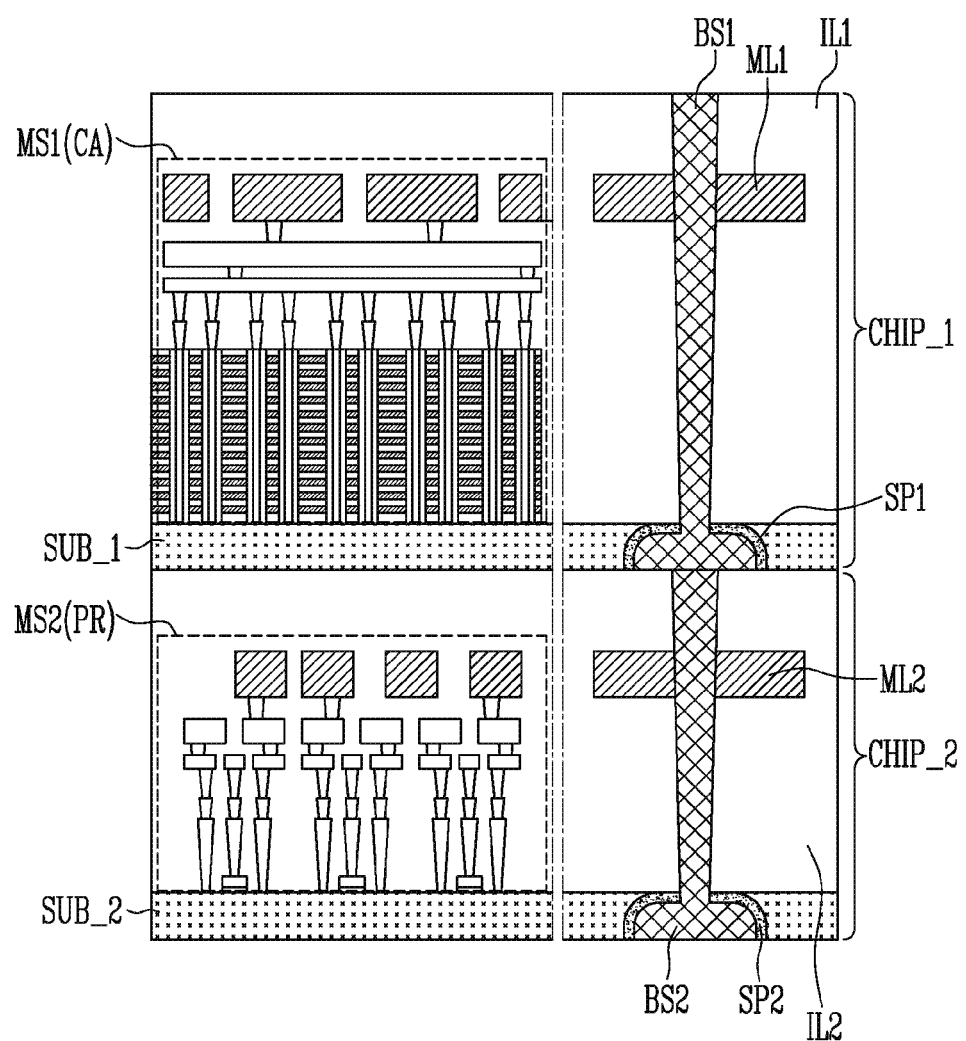

Referring to FIG. 2B, a first chip CHIP_1 may include a first main structure MS1, and the first main structure MS1 may include a cell array CA. In addition, the first main structure MS1 may further include an interconnection structure that is connected to the cell array CA.

A second chip CHIP_2 may include a second main structure MS2, and the second main structure MS2 may include a peripheral circuit PR. In addition, the second main structure MS2 may further include an interconnection structure that is connected to the peripheral circuit PR.

Figure 2C:
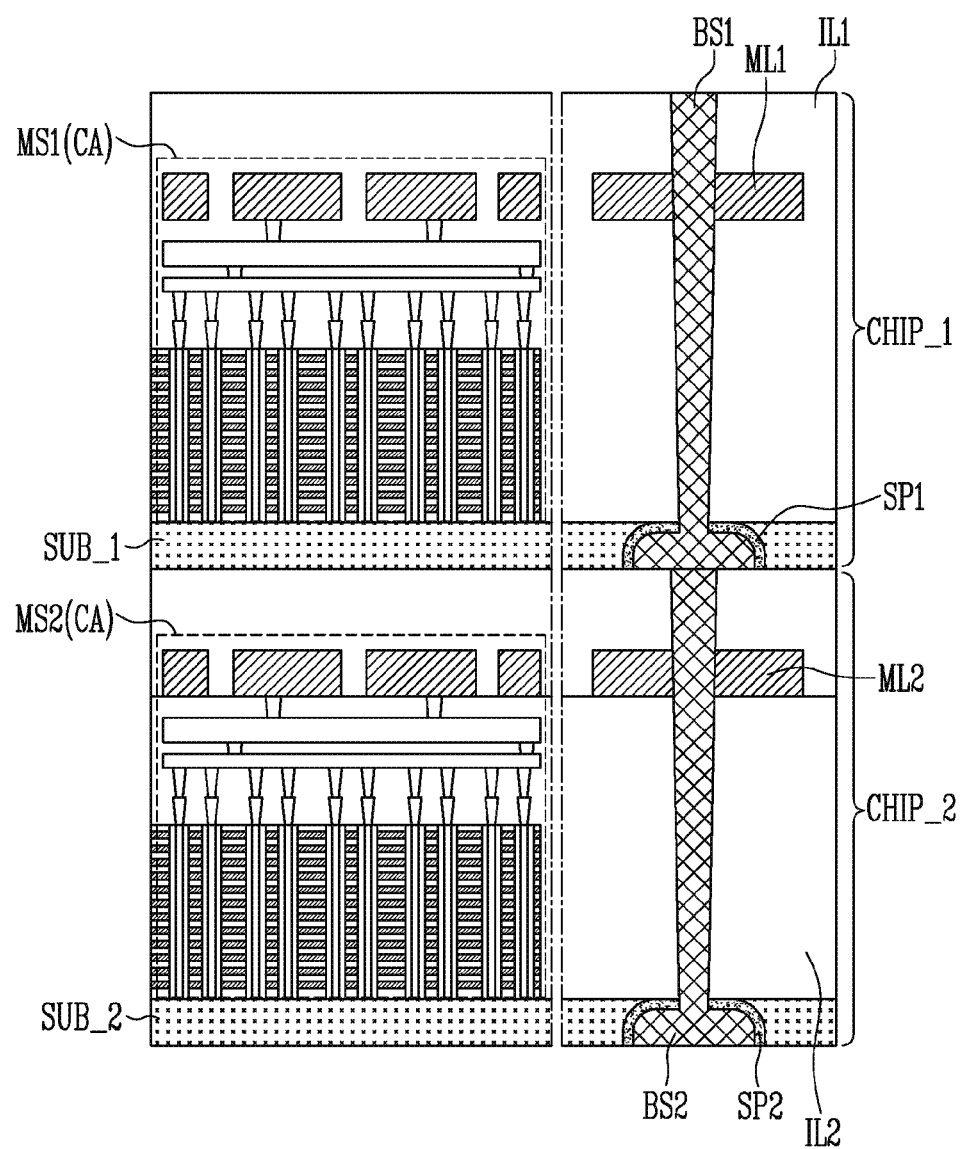

Referring to FIG. 2C, a first chip CHIP_1 may include a first main structure MS1, and the first main structure MS1 may include a cell array CA. In addition, the first main structure MS1 may further include an interconnection structure that is connected to the cell array CA.

A second chip CHIP_2 may include a second main structure MS2, and the second main structure MS2 may include a cell array CA. In addition, the second main structure MS2 may further include an interconnection structure IT that is connected to the cell array CA. For reference, although not shown in the present figure, a third chip that includes a peripheral circuit may be further bonded to the first chip CHIP_1 or the second chip CHIP_2.

Figure 2D:
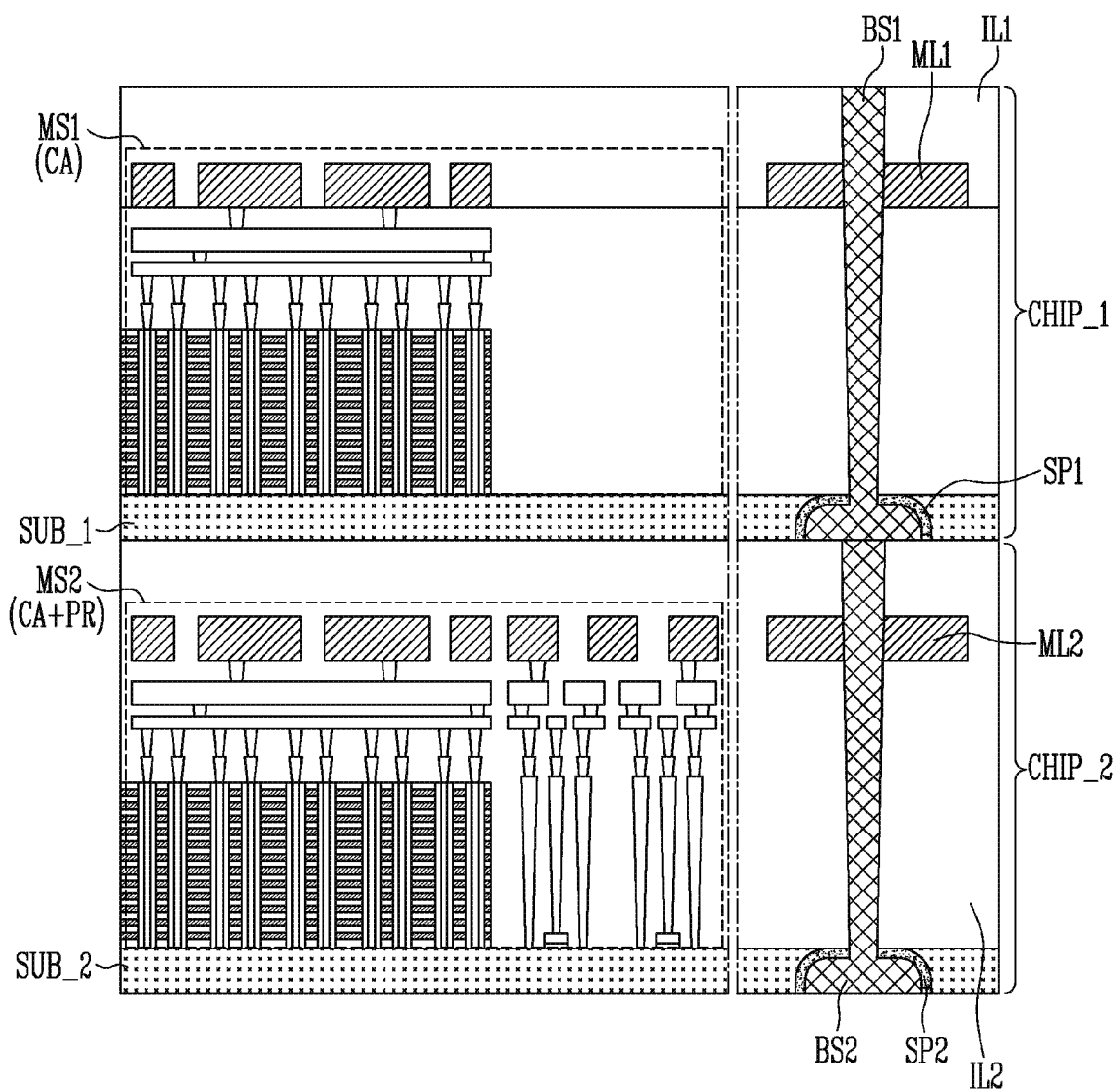

Referring to FIG. 2D, a first chip CHIP_1 may include a first main structure MS1, and the first main structure MS1 may include a cell array CA. In addition, the first main structure MS1 may further include an interconnection structure that is connected to the cell array CA.

A second chip CHIP_2 may include a second main structure MS2, and the second main structure MS2 may include a cell array CA and a peripheral circuit PR. In addition, the second main structure MS2 may further include an interconnection structure that is connected to the cell array CA or the peripheral circuit PR.

According to the structure described above, a plurality of chips may be bonded to each other. The bonded chips may have the same main structure or may have different main structures. The bonded chips may be electrically connected to each other and may share a portion of the main structure. For example, some of the bonded chips may include a peripheral circuit, and in another embodiment, the chips may share a peripheral circuit.

Figure 3:
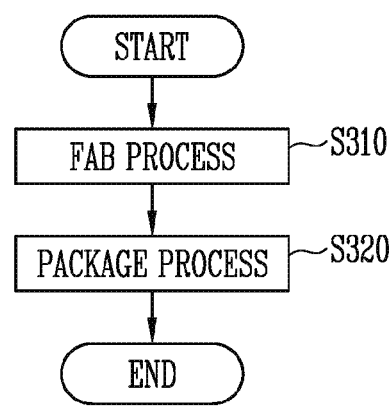
FIG. 3 is a flowchart for describing a method of manufacturing a semiconductor device, according to an embodiment of the present disclosure.

FIG. 3 is a flowchart for describing a method of manufacturing a semiconductor device, according to an embodiment of the present disclosure.

First, a FAB process is performed (S310). Here, the FAB process is also referred to as a wafer level process or an in-line process. The FAB process entails the repeated formation of a pattern on a wafer to form a die that has an integrated circuit. Here, the die may be a chip or a semiconductor chip. The FAB process may include a process of forming a cell array on a substrate, a process of forming a peripheral circuit on a substrate, or a process of forming a cell array and a peripheral circuit on a substrate. In addition, the FAB process may include a process of forming an interconnection that is connected to the cell array or the peripheral circuit.

The FAB process may further include a wafer test. The wafer test is for testing an electrical characteristic of the die. The wafer test may determine a bad die and a normal die. In addition, the FAB process may further include a process of forming a bonding structure. For example, the bonding structure may be formed after an interconnection is formed. Alternatively, the bonding structure may be formed after performing the wafer test.

Next, a package process is performed (S320). The package process entails the connection of an electrical wire so that a chip may receive external power or communicate with an external device. The package process may also entail the packaging of the chip to protect the chip from physical impact or a chemical reaction. The package process may include a grinding process, a cutting process, a bonding process, a marking process, a molding process, and the like. Here, the bonding process may include a process of bonding a chip and a chip to each other, a process of bonding a chip and a wafer to each other, a process of bonding a wafer and a wafer to each other, a wire bonding process, and the like.

According to the process described above, the bonding structure is formed before the package process. For example, the bonding structure is formed in advance in the FAB process. Therefore, a bump, a non-conductive film (NCF), or the like is not required to be formed in the package process. In addition, the chips may be physically and electrically connected to each other at the same time through the bonding process. Therefore, the package process may be simplified and the cost may be reduced.

FIGS. 4A to 4G are diagrams for describing a method of manufacturing a semiconductor device, according to an embodiment of the present disclosure. Hereinafter, description that is repetitive will be omitted.

Figure 4A:
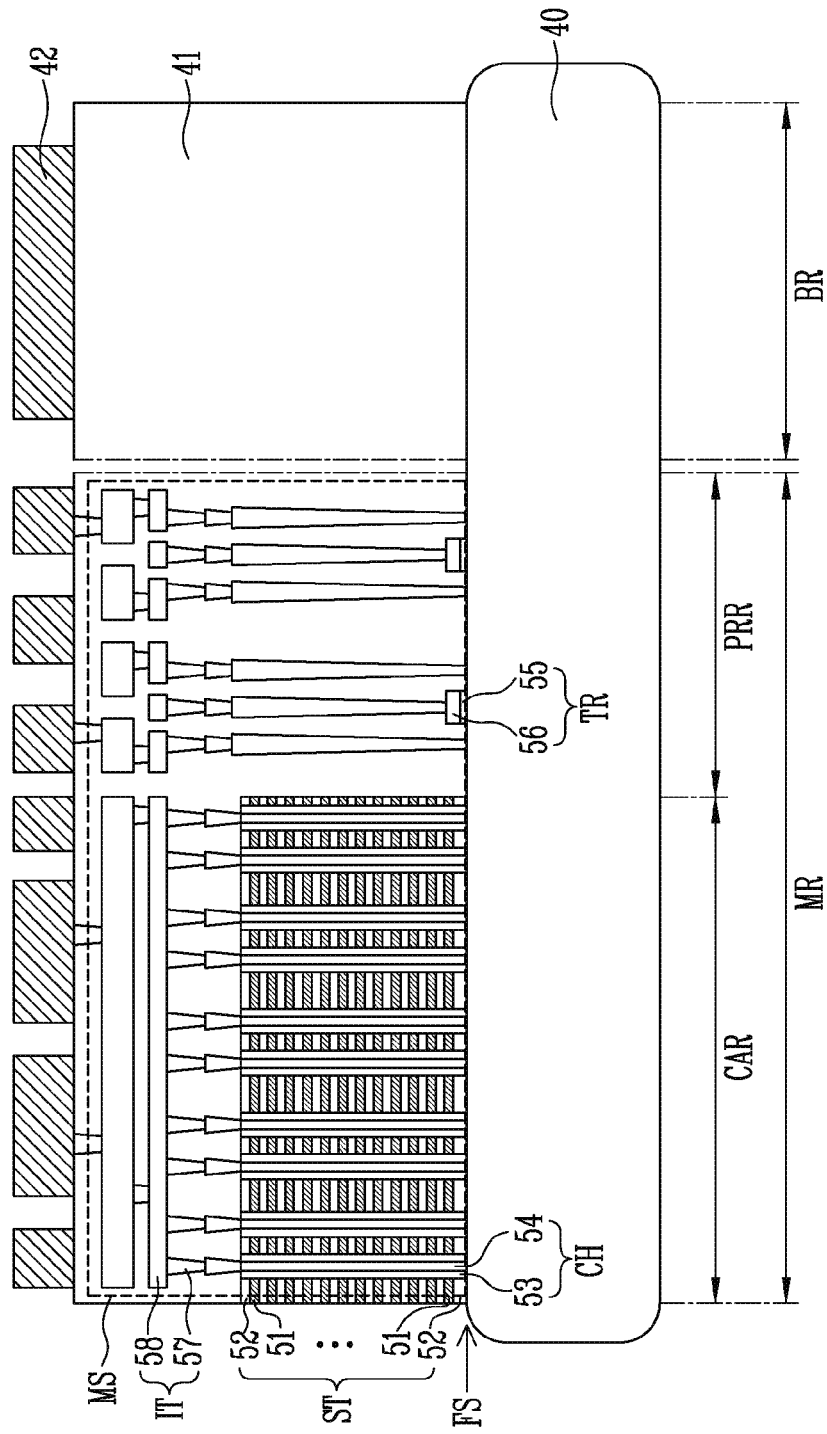
FIGS. 4A to 4G are diagrams for describing a method of manufacturing a semiconductor device, according to an embodiment of the present disclosure.

Referring to FIG. 4A, a main structure MS is formed on a substrate 40. The substrate 40 may be a semiconductor substrate including a semiconductor material such as silicon. The substrate 40 may be a wafer. The substrate 40 may include a main region MR and a bonding pad region BR. The main region MR may include a cell array region CAR and a peripheral circuit region PRR. For reference, the main region MR may include only the cell array region CAR or only the peripheral circuit region PRR.

Next, a main structure MS is formed on a front surface FS of the substrate 40. The main structure MS may be formed in the main region MR and may include at least one of a cell array and a peripheral circuit. A cell array may be formed in the cell array region CAR, and a peripheral circuit may be formed in the peripheral circuit region PRR.

The cell array CA may include a stack ST and a channel structure CH. The stack ST may include conductive films 51 and insulating films 52 that are stacked in an alternating manner. The channel structure CH may include a channel film 54 that passes through the stack ST and a memory film 53 that is interposed between the channel film 54 and the conductive films 51. The memory film 53 may further include at least one of a charge blocking film, a data storage film, and a tunnel insulating film. The channel film 54 may have a tube-like structure, and a gap fill insulating film (not shown) may be formed inside the channel film 54. The peripheral circuit PR may include a transistor TR, and the transistor TR may include a gate electrode 56 and a gate insulating film 55.

In addition, the main structure MS may further include at least one of an interconnection structure IT that is connected to the cell array CA and an interconnection structure IT that is connected to the peripheral circuit PR. The interconnection structure IT may include a contact plug 57, a wire 58, and the like.

The first interlayer insulating film 41 may be formed in the main region MR and the bonding pad region BR. The first interlayer insulating film 41 may include an insulating material, such as an oxide or nitride. The first interlayer insulating film 41 may be a single film or a multilayer film. The main structure MS, such as the cell array, the peripheral circuit, and the interconnection structure, may be formed in the first interlayer insulating film 41. The first interlayer insulating film 41 may be formed before or after the forming of the cell array, the peripheral circuit, or the interconnection structure.

Next, a metal wire 42 is formed on the first interlayer insulating film 41. The metal wire 42 may be formed in the main region MR and the bonding pad region BR. For example, after forming a metal film on the interlayer insulating film 41, a mask pattern is formed on the metal film. Next, the metal film is etched by using the mask pattern as an etching barrier to form the metal wire 42. After the metal wire 42 is formed, the mask pattern may be removed, and a cleaning process may be performed. The metal wire 42 may include a metal, such as aluminum.

Figure 4B:
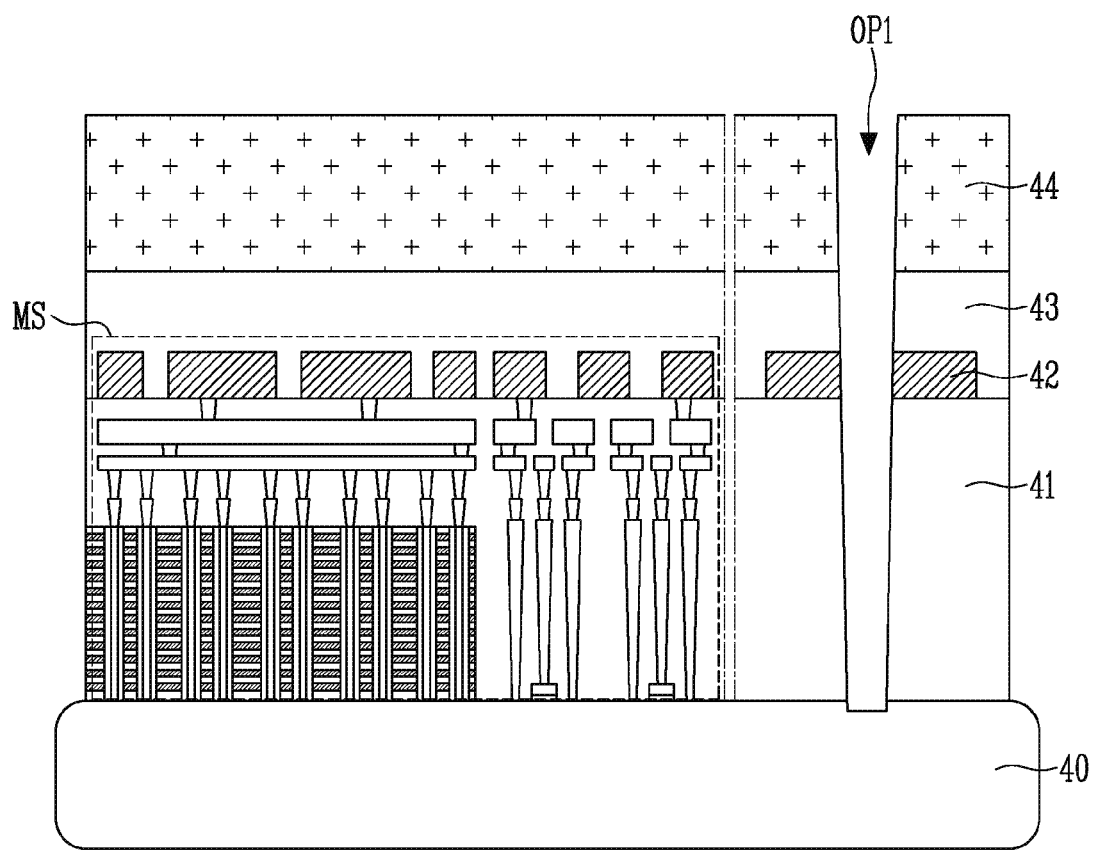

Referring to FIG. 4B, a second interlayer insulating film 43 is formed on the metal wire 42. After an insulating material is deposited on the metal wire 42, a planarization process may be performed to form the second interlayer insulating film 43. The planarization process may be performed through a method of chemical mechanical polishing (CMP). The second interlayer insulating film 43 may include an insulating material, such as an oxide or a nitride. For example, the second interlayer insulating film 43 may include an oxide film formed through a method of high density plasma (HDP).

Next, a first opening OP1, passing through the second interlayer insulating film 43, the metal wire 42, and the first interlayer insulating film 41 and exposing the substrate 40, is formed. The first opening OP1 may be formed by using an etching process. First, a mask pattern 44, used for forming a bonding structure, is formed on the second interlayer insulating film 43. The mask pattern 44 may cover the cell array region CAR and the peripheral circuit region PRR and partially expose the bonding pad region BR. Next, the first opening OP1 is formed by etching the second interlayer insulating film 43, the metal wire 42, and the first interlayer insulating film 41 by using the mask pattern 44 as an etching barrier. After forming the first opening OP1, the mask pattern 44 may be removed and a cleaning process may be performed.

The first opening OP1 may be formed at a depth that exposes the substrate 40. The first opening OP1 may pass through the metal wire 42, and the metal wire 42 may be exposed through the first opening OP1.

Figure 4C:
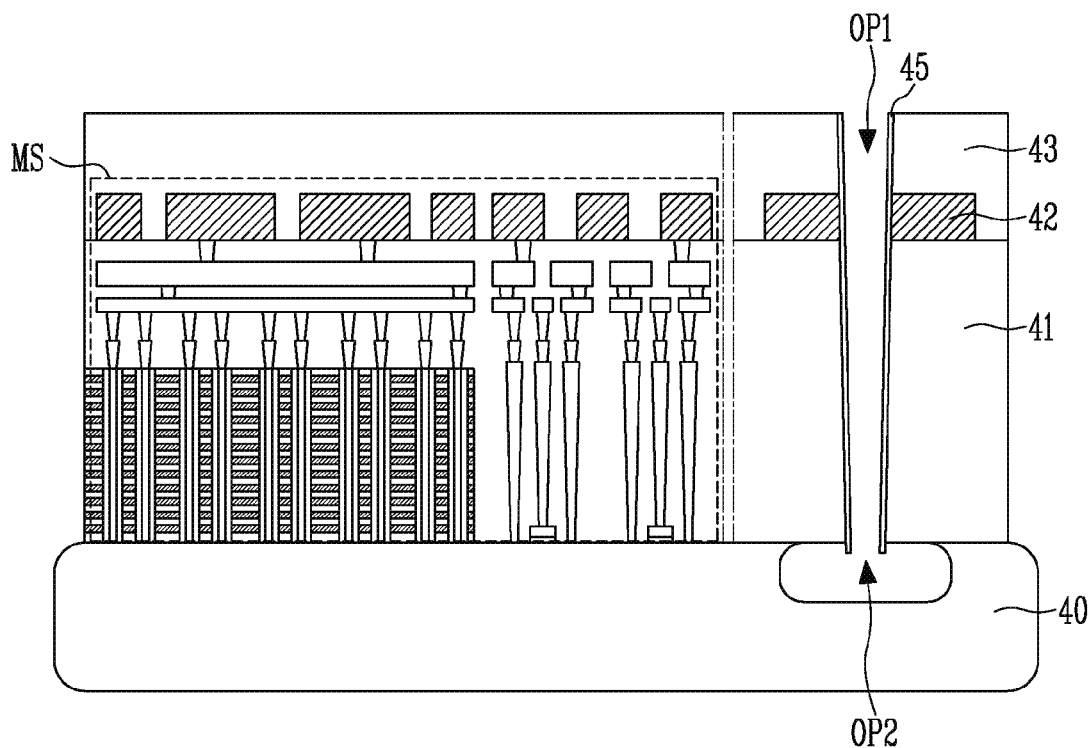

Referring to FIG. 4C, a protective spacer 45 is formed in the first opening OP1. The protective spacer 45 protects the first interlayer insulating film 41, the metal wire 42, and the second interlayer insulating film 43 in a subsequent process. The protective spacer 45 may include a material that has a high etching selectivity with respect to the substrate 40. When the substrate 40 includes silicon, the protective spacer 45 may include nitride. In an embodiment, after forming a spacer material along an inner surface of the first opening OP1, an etch back process is performed. The spacer material, formed on a lower surface of the first opening OP1, may be etched through the etch back process, and the protective spacer 45 may be formed.

Next, the substrate 40 is etched to form a second opening OP2. The second opening OP2 may be connected to the first opening OP1. The second opening OP2 may be wider than the first opening OP1. The second opening OP2 may be formed by using an isotropic etching process. For example, the second opening OP2 is formed by using a dry cleaning process, a wet etching process, or a combination thereof. The second opening OP2 may have corners between an upper surface and a sidewall and between a lower surface and the sidewall, in a cross-sectional view. In addition, at least one of the corners may have a rounded shape. For example, the second opening OP2 may have a bulb shape.

Figure 4D:
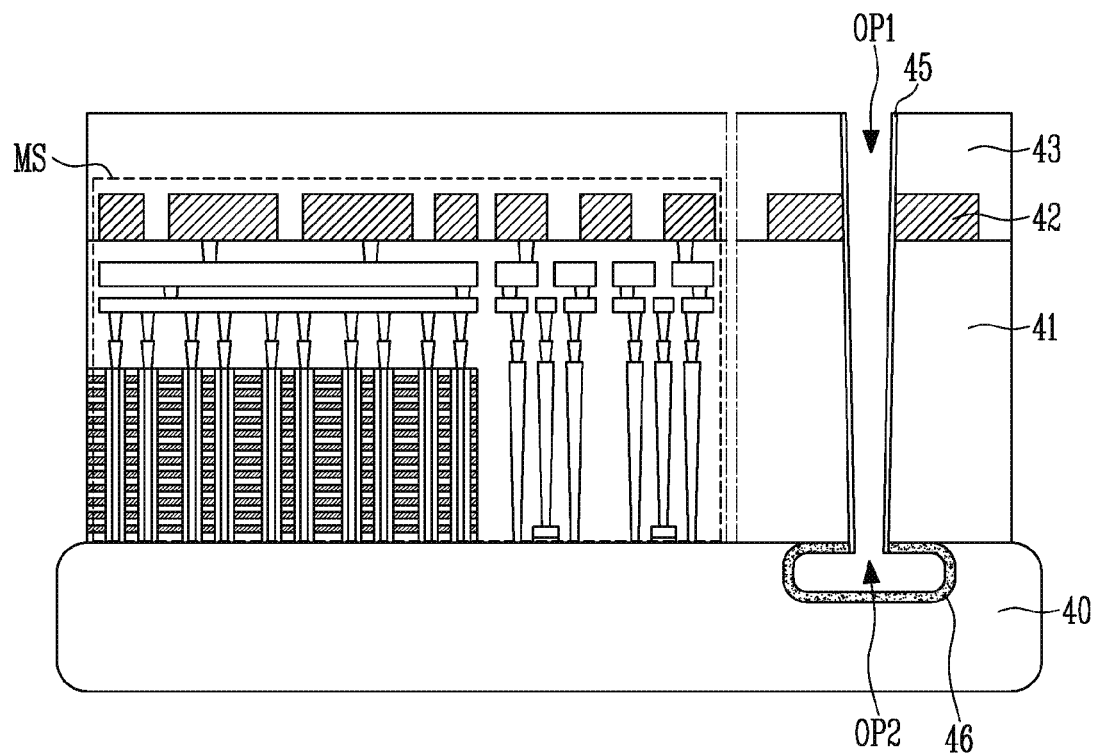

Referring to FIG. 4D, an insulating spacer 46 is formed in the second opening OP2. The bonding structure and the substrate 40, formed in a subsequent process, may be insulated from each other through the insulating spacer 46. The insulating spacer 46 may include an insulating material, such as an oxide or a nitride. The insulating spacer 46 may be formed along an inner surface of the second opening OP2. For example, a surface of the second substrate 40 that is exposed through the second opening OP2 is oxidized to form the insulating spacer 46. Since the metal wire 42, which is exposed through the first opening OP1, is protected by the protective spacer 45, the metal wire 42 may be prevented from being oxidized in the oxidation process.

Figure 4E:
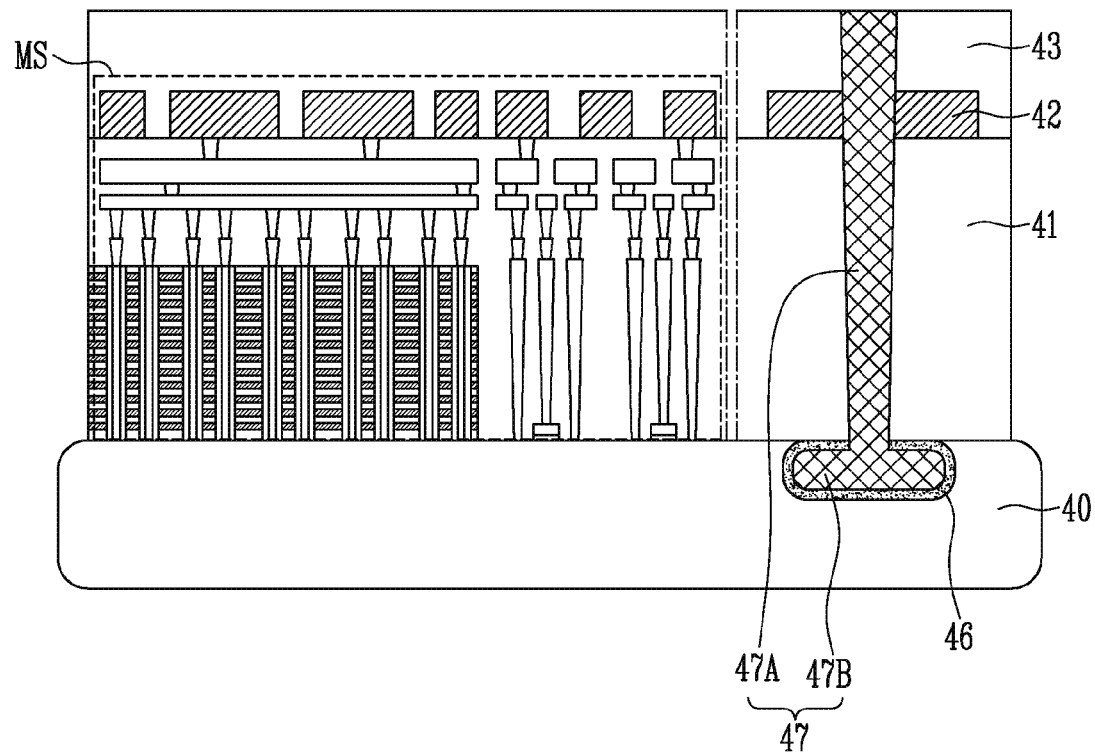

Referring to FIG. 4E, the protective spacer 45 is removed. Next, a bonding structure 47 is formed in the first opening OP1 and the second opening OP2. The bonding structure 47 may include a through portion 47A in the first opening OP1 and a bonding portion 47B in the second opening OP2. The through portion 47A may be in contact with the metal wire 42. The bonding portion 47B may be formed in the substrate 40 and may be in contact with the insulating spacer 46.

The bonding structure 47 may include a metal, such as copper, and may be formed through a deposition method. For example, the bonding structure 47 is formed through an electroless plating (EP) deposition method. After a metal film is formed to fill the first and second openings OP1 and OP2, the bonding structure 47 may be formed by planarizing the metal film. A planarization process may be performed based on the chemical mechanical polishing (CMP) method.

Figure 4F:
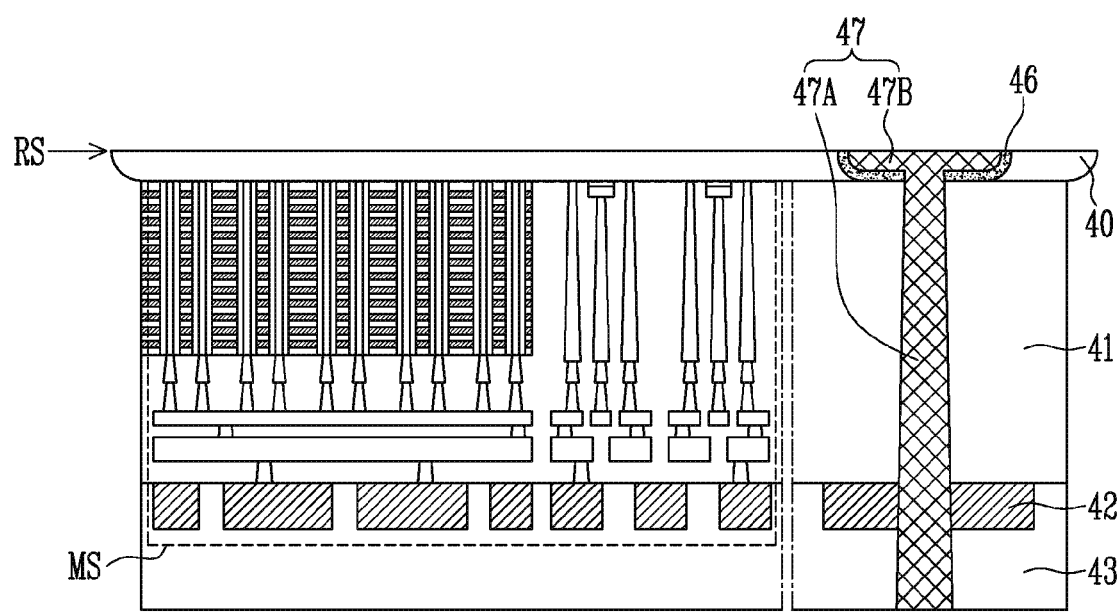

Referring to FIG. 4F, the substrate 40 is turned upside down so that a rear surface RS of the substrate 40 is on top. Next, the substrate 40 is partially removed until the bonding structure 47 is exposed. Therefore, the bonding structure 47 may be exposed on the rear surface RS of the substrate 40. Specifically, the bonding portion 47B may be exposed on the rear surface RS of the substrate 40. In an embodiment, the substrate 40 may be partially removed by using a back grinding method, a chemical mechanical polishing (CMP) method, or a wet etching process, or a combination thereof. In the process of partially removing the substrate 40, a portion of the bonding portion 47B and a portion of the insulating spacer 46 may be removed as well. In addition, the width of the remaining bonding portion 47B may be adjusted according to the amount of the substrate 40 that is removed.

Figure 4G:
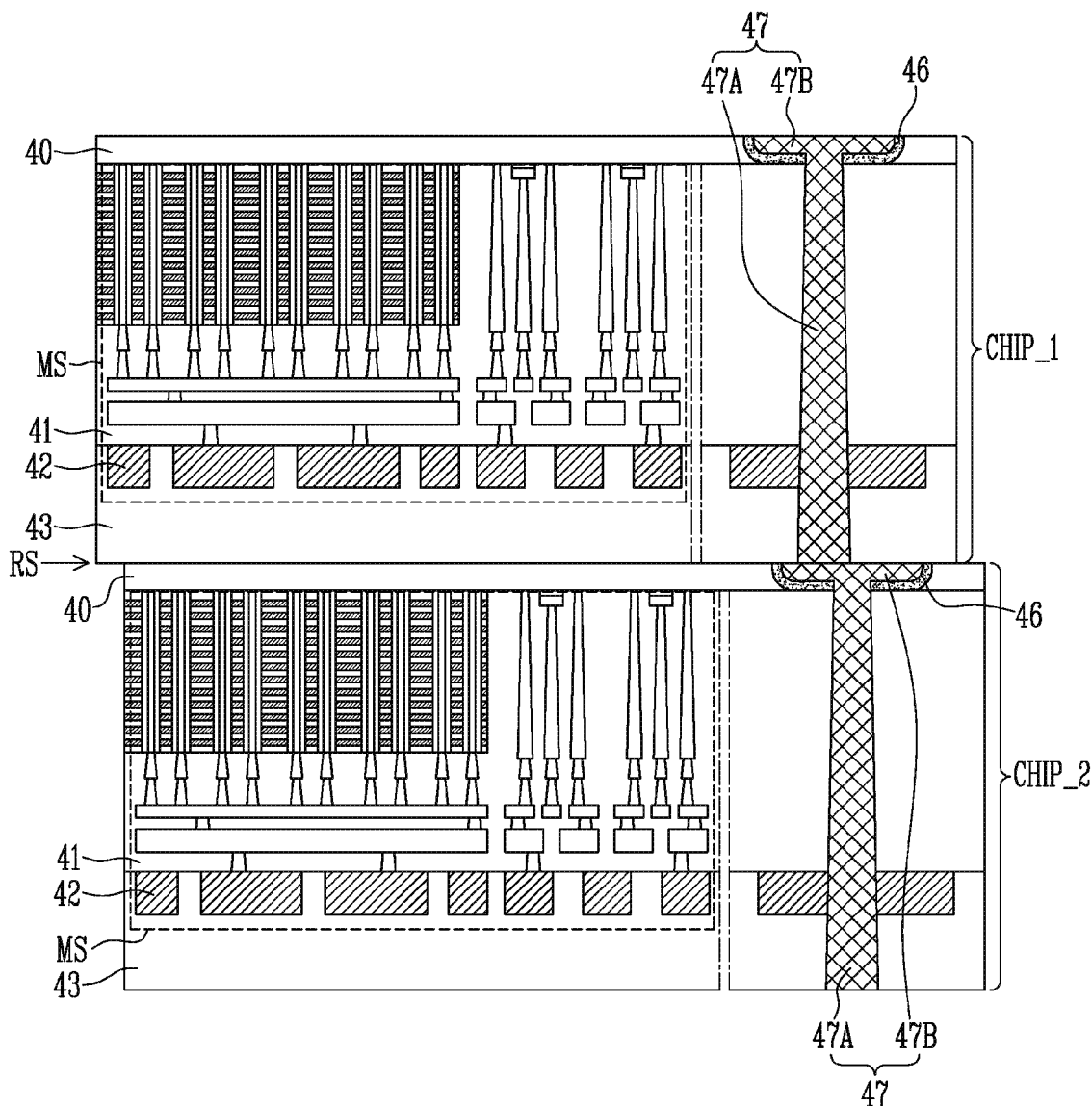

Referring to FIG. 4G, a first chip CHIP_1 and a second chip CHIP_2 are bonded to each other.

The first chip CHIP_1 and the second chip CHIP_2 may be prepared by repeating the processes of FIGS. 4A to 4F. In addition, in order to prepare the first chip CHIP_1 and the second chip CHIP_2, a process of cutting the wafer into a chip unit may be further performed. For example, the substrate 40 on which the main structure MS, the bonding structure 47, and the like are formed, is cut and separated into a plurality of chips.

The first chip CHIP_1 and the second chip CHIP_2 may include the same main structure MS or may include different main structures MS. Two or more chips may be bonded to each other. In addition to bonding a chip and a chip to each other chips, a wafer and a wafer or a wafer and a chip may be bonded to each other.

The second interlayer insulating film 43 of the first chip CHIP_1 and the substrate 40 of the second chip CHIP_2 may be bonded to each other through the bonding process. For example, the rear surface RS of the substrate 40 of the second chip CHIP_2 may be in contact with and bonded to the second interlayer insulating film 43 of the first chip CHIP_1.

The bonding structure 47 of the first chip CHIP_1 and the bonding structure 47 of the second chip CHIP_2 may be bonded to each other. For example, the through portion 47A of the first chip CHIP_1 and the bonding portion 47B of the second chip CHIP_2 may be bonded to each other. Therefore, the bonding structure 47 of the first chip CHIP_1 and the bonding structure 47 of the second chip CHIP_2 may be electrically connected to each other, and the first chip CHIP_1 and the second chip CHIP_2 may be electrically connected to each other. In addition, since the bonding portion 47B of the second chip CHIP_2 is wider than the through portion 47A of the first chip CHIP_1, the margin of error for alignment between the first chip CHIP_1 and the second chip CHIP_2 may be increased.

Next, although not shown in the present figure, an additional packaging process, such as wire bonding, molding, and marking, may be performed.

In the above-described method, FIGS. 4A to 4E may correspond to the FAB process S310 of FIG. 3, and FIGS. 4F and 4G may correspond to the package process S320 of FIG. 3. According to the above-described method, the bonding structure may be formed in the FAB process. Therefore, a bump, a non-conductive film (NCF), or the like is not required to be formed. In addition, the physical and electrical connection between the first chip CHIP_1 and the second chip CHIP_2 may be simultaneously performed. Therefore, the package process may be simplified and the cost may be reduced.

Figure 5A:
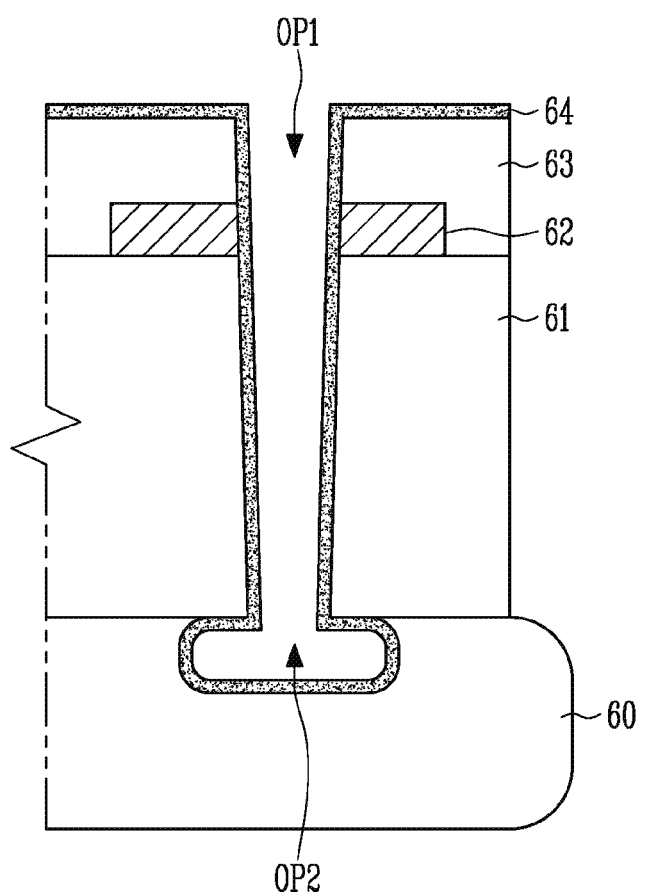
FIGS. 5A to 5C are diagrams for describing a method of manufacturing a semiconductor device, according to an embodiment of the present disclosure.
Figure 5B:
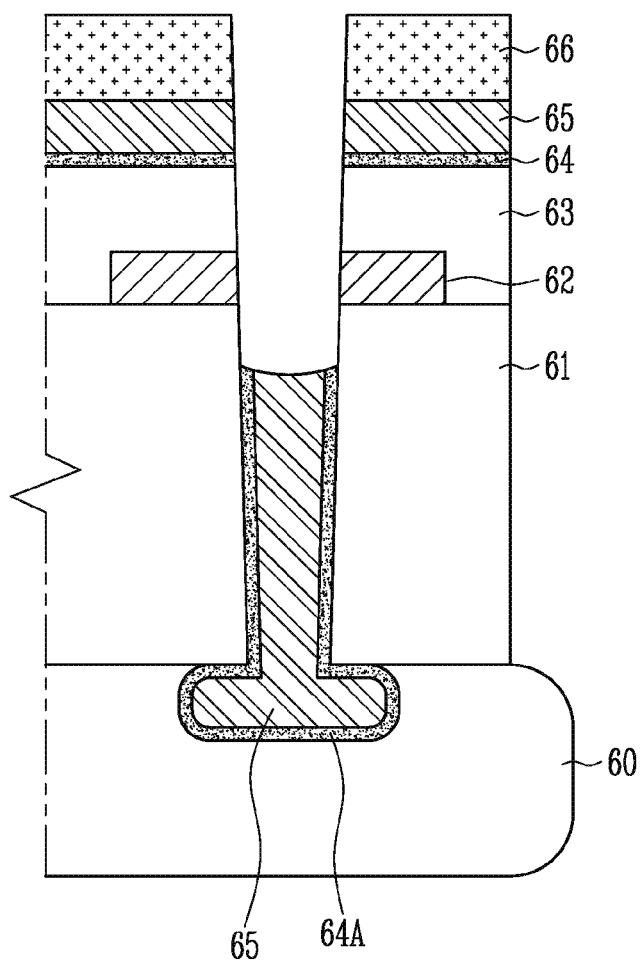
Figure 5C:
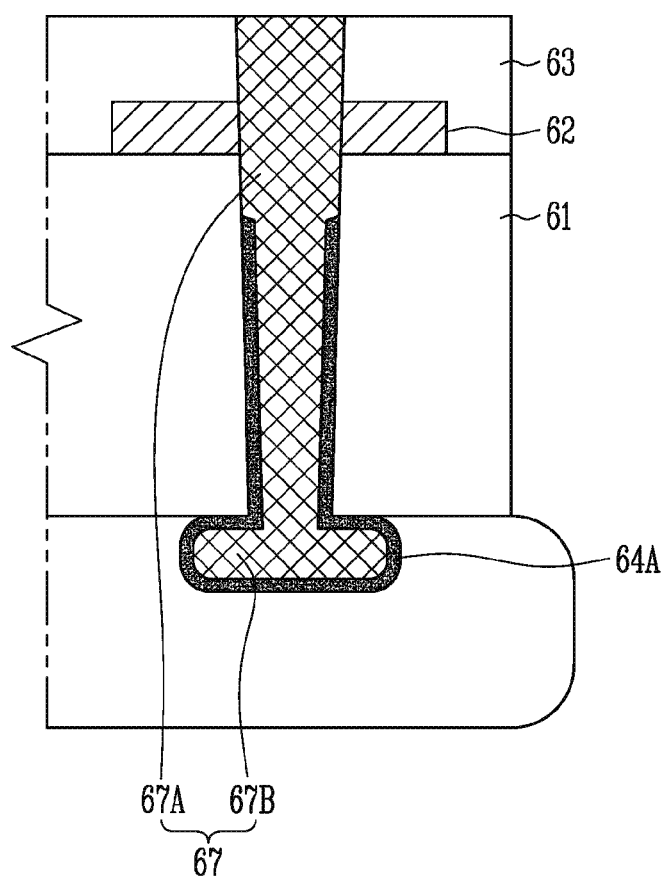

FIGS. 5A to 5C are diagrams for describing a method of manufacturing a semiconductor device, according to an embodiment of the present disclosure, and relates to a method of forming a bonding structure. Hereinafter, descriptions that are repetitive will be omitted.

Referring to FIG. 5A, a first opening OP1, passing through a second interlayer insulating film 63, a metal wire 62, and a first interlayer insulating film 61, and a second opening OP2 that are positioned in a substrate 60, are formed.

Next, an insulating material 64 is formed in the first opening OP1 and the second opening OP2. For example, the insulating material is deposited along the inner surfaces of the first opening OP1 and the second opening OP2. The insulating material 64 may also be formed on the second interlayer insulating film 63. The insulating material 64 may include an oxide.

Referring to FIG. 5B, the insulating material 64 is partially etched to expose the metal wires 62 in the first opening OP1. In order to partially etch the insulating material 64, a sacrificial film 65 and a mask pattern 66 may be used. First, the sacrificial film 65 and the mask pattern 66 are formed.

The sacrificial film 65 may be formed to fill the second opening OP2 and at least partially fill the first opening OP1. The sacrificial film 65 may include a liquidity material such as spin on carbon (SOC). The sacrificial film 65 may also be formed on the second interlayer insulating film 63.

Next, the insulating material 64 is etched using the mask pattern 66 as an etching barrier. Therefore, the metal wire 62 is exposed, and the insulating spacer 64A is formed. Next, the mask pattern 66, the sacrificial film 65, and the insulating material 64 may be removed and a cleaning process may be performed.

Referring to FIG. 5C, a bonding structure 67 is formed. The bonding structure 67 may include a through portion 67A that is in contact with the metal wire 62 and a bonding portion 67B that is formed in the substrate 60. The insulating spacer 64A may be interposed between the bonding portion 67B and the substrate 60 to insulate the bonding portion 67B and the substrate 60 from each other. In addition, the insulating spacer 64A may extend up to a portion of the sidewall of the through portion 67A and may be formed to surround a portion of the sidewall of the through portion 67A. The insulating spacer 64A may be interposed between the through portion 67A and the first interlayer insulating film 61. However, the insulating spacer 64A is not interposed between the through portion 67A and the metal wire 62. Next, although not shown in the present figure, the process described above, with reference to FIGS. 4F and 4G, may be further performed.

According to the above-described manufacturing method, the insulating spacer 64A may be formed using a deposition process.

Figure 6:
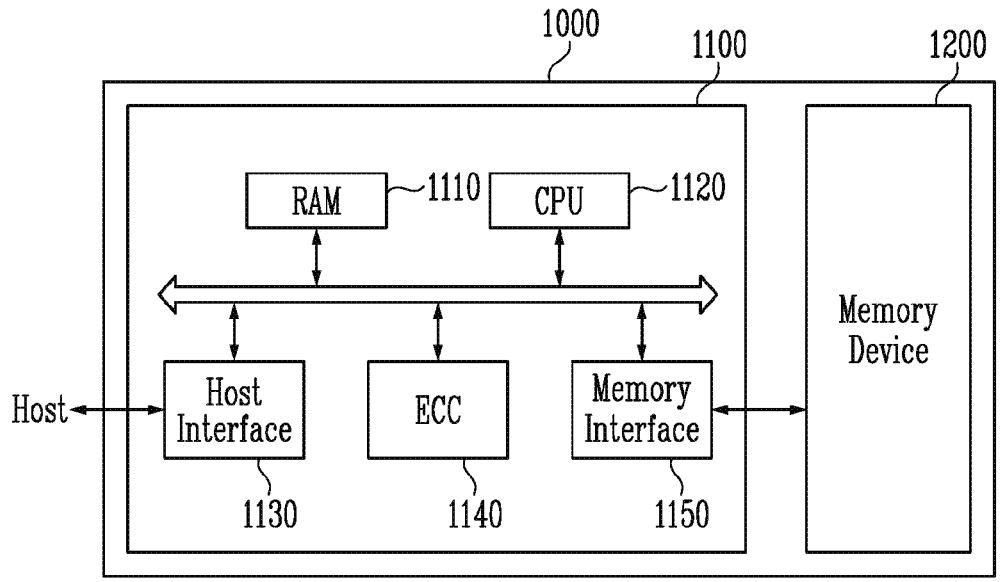
FIG. 6 is a block diagram, illustrating a configuration of a memory system, according to an embodiment of the present disclosure.

FIG. 6 is a block diagram illustrating a configuration of a memory system, according to an embodiment of the present disclosure.

Referring to FIG. 6, the memory system 1000 includes a memory device 1200 and a controller 1100.

The memory device 1200 is used to store various data types, such as a text, a graphic, and a software code. The memory device 1200 may be a non-volatile memory. In addition, the memory device 1200 may have the structure that is described above with reference to FIGS. 1A to 5C. The memory device 1200 may be manufactured based on the manufacturing method that is described with reference to FIGS. 1A to 5C. As an embodiment, the memory device 1200 may include a first chip that includes a first substrate, a first cell array, a first metal wire, and a first bonding structure. The first bonding structure may include a first through portion that passes through the first metal wire and a first bonding portion, formed in the first substrate. A second chip may include a second substrate, a second cell array, a second metal wire, and a second bonding structure. The second bonding structure may include a second through portion that passes through the second metal wire and a second bonding portion, formed in the second substrate. The second chip may be bonded to the first chip. Specifically, the first bonding portion of the first chip and the second through portion of the second chip may be bonded to each other. Since the structure of the memory device 1200 and the method of manufacturing the memory device 1200 are the same as the description in reference FIGS. 1A to 5C, a detailed description thereof will be omitted.

The controller 1100 is connected to a host, and the memory device 1200 and is configured to access the memory device 1200 in response to a request from the host.

For example, the controller 1100 is configured to control read, write, erase, and background operations, and the like of the memory device 1200.

The controller 1100 includes a random access memory (RAM) 1110, a central processing unit (CPU) 1120, a host interface 1130, an error correction code circuit 1140, a memory interface 1150, and the like.

Here, the RAM 1110 may be used as an operation memory of the CPU 1120, a cache memory between the memory device 1200 and the host, a buffer memory between the memory device 1200 and the host, and the like. For reference, the RAM 1110 may be replaced with a static random access memory (SRAM), a read only memory (ROM), or the like.

The CPU 1120 is configured to control overall operation of the controller 1100. For example, the CPU 1120 is configured to operate firmware such as a flash translation layer (FTL) stored in the RAM 1110.

The host interface 1130 is configured to perform an interface with the host. For example, the controller 1100 communicates with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data read from the memory device 1200 using an error correction code (ECC).

The memory interface 1150 is configured to perform interfacing with the memory device 1200. For example, the memory interface 1150 includes a NAND interface or a NOR interface.

For reference, the controller 1100 may further include a buffer memory (not shown) for temporarily storing data. Here, the buffer memory may be used to temporarily store data transferred to the outside through the host interface 1130, or to temporarily store data transferred from the memory device 1200 through the memory interface 1150. In addition, the controller 1100 may further include a ROM that stores code data for interfacing with the host.

As described above, since the memory system 1000 according to an embodiment of the present disclosure includes the memory device 1200 having an improved degree of integration and an improved characteristic, a degree of integration and a characteristic of the memory system 1000 may also be improved.

Figure 7:
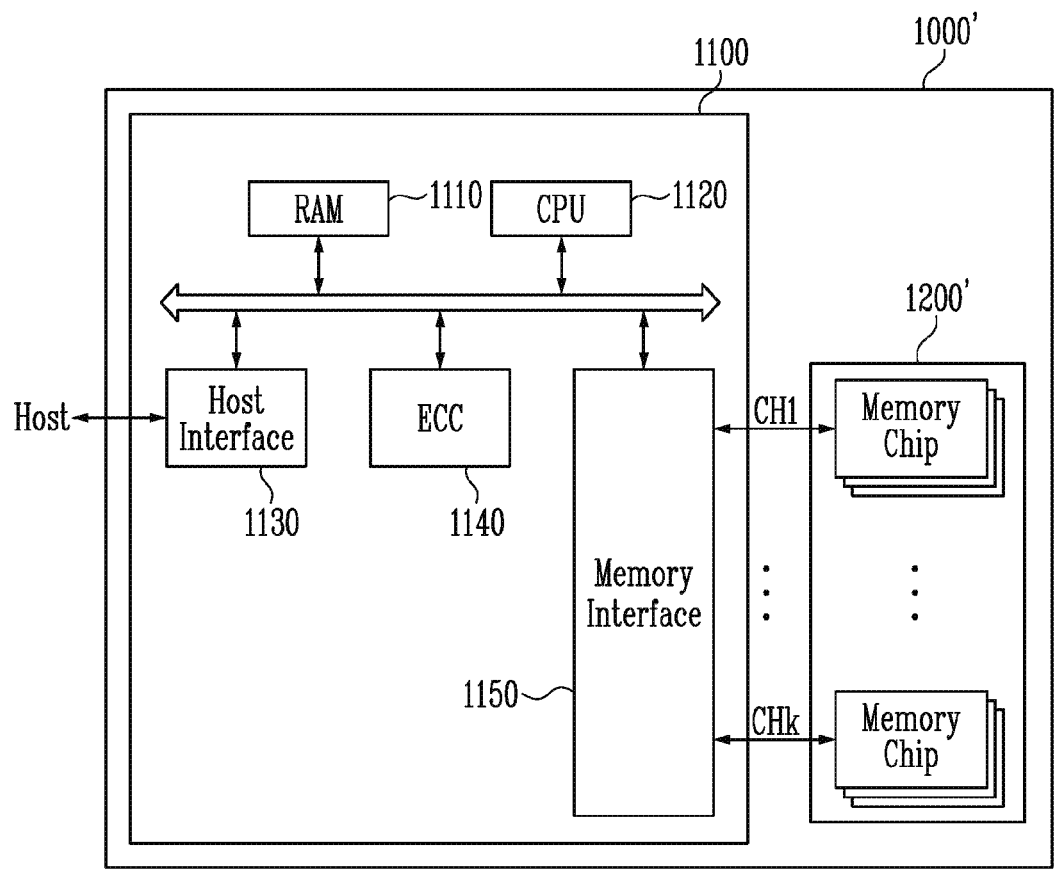
FIG. 7 is a block diagram, illustrating a configuration of a memory system, according to an embodiment of the present disclosure.

FIG. 7 is a block diagram, illustrating a configuration of a memory system, according to an embodiment of the present disclosure. Hereinafter, descriptions that are repetitive will be omitted.

Referring to FIG. 7, the memory system 1000' includes a memory device 1200' and a controller 1100. In addition, the controller 1100 includes a RAM 1110, a CPU 1120, a host interface 1130, an ECC circuit 1140, a memory interface 1150, and the like.

The memory device 1200' may be a non-volatile memory. The memory device 1200' may have the structure that is described above with reference to FIGS. 1A to 5C and may be manufactured according to the manufacturing method that is described with reference to FIGS. 1A to 5C. As an embodiment, the memory device 1200' may include a first chip that includes a first substrate, a first cell array, a first metal wire, and a first bonding structure. The first bonding structure may include a first through portion that passes through the first metal wire and a first bonding portion, formed in the first substrate. A second chip may include a second substrate, a second cell array, a second metal wire, and a second bonding structure. The second bonding structure may include a second through portion that passes through the second metal wire and a second bonding portion, formed in the second substrate. The second chip may be bonded to the first chip. Specifically, the first bonding portion of the first chip and the second through portion of the second chip may be bonded to each other. Since the structure of the memory device 1200' and the method of manufacturing the memory device 1200' are the same as the description in reference FIGS. 1A to 5C, a detailed description thereof will be omitted.

In addition, the memory device 1200' may be a multi-chip package configured of a plurality of memory chips. The plurality of memory chips are divided into a plurality of groups, and the plurality of groups are configured to communicate with the controller 1100 through first to k-th channels CH1 to CHk. In addition, the memory chips that belong to one group are configured to communicate with the controller 1100 through a common channel. For reference, the memory system 1000' may be modified such that one memory chip is connected to one channel.

As described above, since the memory system 1000' according to an embodiment of the present disclosure includes the memory device 1200' having an improved degree of integration and an improved characteristic, a degree of integration and a characteristic of the memory system 1000' may also be improved. In particular, by configuring the memory device 1200' in a multi-chip package, data storage capacity of the memory system 1000' may be increased, and the driving speed may be improved.

Figure 8:
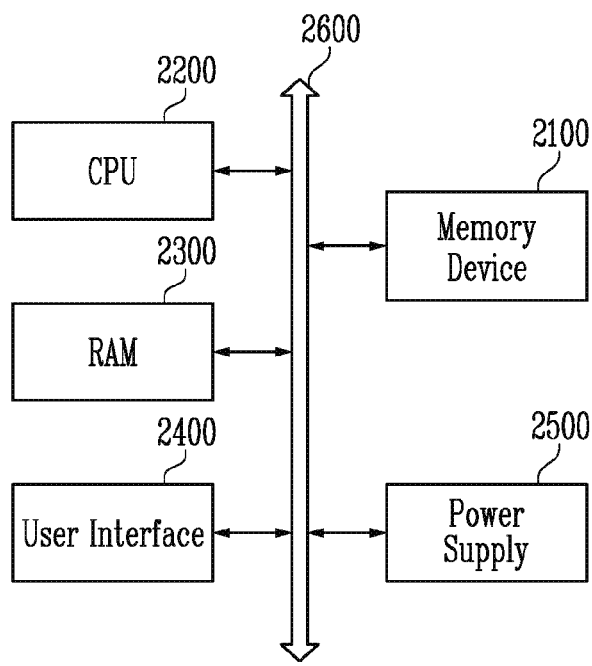
FIG. 8 is a block diagram illustrating a configuration of a computing system according to an embodiment of the present disclosure.

FIG. 8 is a block diagram, illustrating a configuration of a computing system, according to an embodiment of the present disclosure. Hereinafter, descriptions that are repetitive will be omitted.

Referring to FIG. 8, the computing system 2000 includes a memory device 2100, a CPU 2200, a RAM 2300, a user interface 2400, a power supply 2500, a system bus 2600, and the like.

The memory device 2100 stores data that is provided through the user interface 2400, data that is processed by the CPU 2200, and the like. In addition, the memory device 2100 is electrically connected to the CPU 2200, the RAM 2300, the user interface 2400, the power supply 2500, and the like through the system bus 2600. For example, the memory device 2100 may be connected to the system bus 2600 through a controller (not shown) or may be directly connected to the system bus 2600. When the memory device 2100 is directly connected to the system bus 2600, the function of the controller may be performed by the CPU 2200, the RAM 2300, and the like.

Here, the memory device 2100 may be a non-volatile memory. The memory device 2100 may have the structure that is described above with reference to FIGS. 1A to 5C, and may be manufactured according to the manufacturing method that is described with reference to FIGS. 1A to 5C. As an embodiment, the memory device 2100 may include a first chip that includes a first substrate, a first cell array, a first metal wire, and a first bonding structure. The first bonding structure may include a first through portion that passes through the first metal wire and a first bonding portion, formed in the first substrate. A second chip may include a second substrate, a second cell array, a second metal wire, and a second bonding structure. The second bonding structure may include a second through portion that passes through the second metal wire and a second bonding portion, formed in the second substrate. The second chip may be bonded to the first chip. Specifically, the first bonding portion of the first chip and the second through portion of the second chip may be bonded to each other. Since the structure of the memory device 2100 and the method of manufacturing the memory device 2100 are the same as the description in reference FIGS. 1A to 5C, a detailed description thereof will be omitted.

In addition, the memory device 2100 may be a multi-chip package that includes a plurality of memory chips as described with reference to FIG. 7.

The computing system having such a configuration may be a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or the like.

As described above, since the computing system 2000 according to an embodiment of the present disclosure includes the memory device 2100 having an improved degree of integration and an improved characteristic, a characteristic of the computing system 2000 may also be improved.

Figure 9:
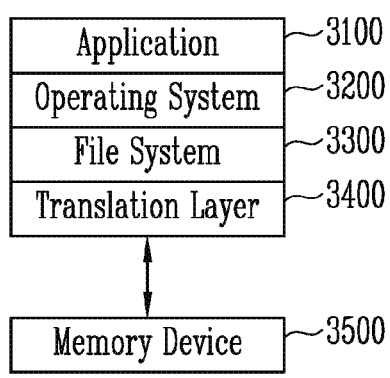
FIG. 9 is a block diagram, illustrating a computing system, according to an embodiment of the present disclosure.

FIG. 9 is a block diagram, illustrating a computing system, according to an embodiment of the present disclosure.

Referring to FIG. 9, the computing system 3000 includes a software layer that includes an operating system 3200, an application 3100, a file system 3300, a translation layer 3400, and the like. In addition, the computing system 3000 includes a hardware layer such as a memory device 3500.

The operating system 3200 may manage software, hardware resources, and the like of the computing system 3000, and may control program execution of a central processing unit. The application 3100 may be various application programs that are executed on the computing system 3000 and may be a utility that is executed by the operating system 3200.

The file system 3300 refers to a logical structure for managing data, a file, and the like that exist in the computing system 3000. The file system 3300 may organize the file or data to be stored in the memory device 3500 based on a rule. The file system 3300 may be determined based on the operating system 3200 that is used in the computing system 3000. For example, when the operating system 3200 is a Windows system of Microsoft company, the file system 3300 may be a file allocation table (FAT), an NT file system (NTFS), or the like. In addition, when the operating system 3200 is a Unix/Linux system, the file system 3300 may be an extended file system (EXT), a Unix file system (UFS), a journaling file system (JFS), or the like.

Although the operating system 3200, the application 3100, and the file system 3300 are shown as separate blocks in the present figure, the application 3100 and the file system 3300 may be included in the operating system 3200.

The translation layer 3400 converts an address in a form suitable for the memory device 3500 in response to a request from the file system 3300. For example, the translation layer 3400 converts a logical address generated by the file system 3300 into a physical address of the memory device 3500. Here, mapping information of the logical address and the physical address may be stored in an address translation table. For example, the translation layer 3400 may be a flash translation layer (FTL), a universal flash storage link layer (ULL), or the like.

The memory device 3500 may be a non-volatile memory. In addition, the memory device 3500 may have the structure described above with reference to FIGS. 1A to 5C, and may be manufactured according to the manufacturing method described with reference to FIGS. 1A to 5C. As an embodiment, the memory device 3500 may include a first chip that includes a first substrate, a first cell array, a first metal wire, and a first bonding structure. The first bonding structure may include a first through portion that passes through the first metal wire and a first bonding portion, formed in the first substrate. A second chip may include a second substrate, a second cell array, a second metal wire, and a second bonding structure. The second bonding structure may include a second through portion that passes through the second metal wire and a second bonding portion, formed in the second substrate. The second chip may be bonded to the first chip. Specifically, the first bonding portion of the first chip and the second through portion of the second chip may be bonded to each other. Since the structure of the memory device 3500 and the method of manufacturing the memory device 3500 are the same as the description in reference FIGS. 1A to 5C, a detailed description thereof will be omitted.

The computing system 3000, having such a configuration, may be divided into an operating system layer that is performed in a higher level region and a controller layer that is performed in a lower level region. Here, the application 3100, the operating system 3200, and the file system 3300 may be included in the operating system layer and may be driven by an operation memory of the computing system 3000. In addition, the translation layer 3400 may be included in the operating system layer or in the controller layer.

As described above, since the computing system 3000 includes the memory device 3500, having an improved degree of integration and an improved characteristic, a characteristic of the computing system 3000 may also be improved.

Although the technical spirit of the present disclosure has been specifically described according to the embodiments, it should be noted that the above-described embodiments are for the purpose of description and not of limitation. In addition, those skilled in the art will understand that various embodiments are possible within the scope of the technical spirit of the present disclosure.

What is claimed is:
1. A semiconductor device comprising:
   a first chip including a first semiconductor substrate, a first cell array, a first metal wire, and a first bonding structure, wherein the first bonding structure includes a first through portion that passes through the first metal wire and a first bonding portion that is formed in the first semiconductor substrate; and
   a second chip, bonded to the first chip, including a second semiconductor substrate, a second cell array, a second metal wire, and a second bonding structure, wherein the second bonding structure includes a second through portion that passes through the second metal wire and a second bonding portion formed in the second semiconductor substrate, wherein the first bonding portion of the first chip is configured to be bonded to the second through portion of the second chip.

2. The semiconductor device of claim 1, wherein the first bonding portion has a width that is wider than a width of the first through portion, and wherein the second bonding portion has a width that is wider than a width of the second through portion.

3. The semiconductor device of claim 1, wherein the first chip further includes an insulating spacer interposed between the first bonding portion and the first semiconductor substrate.

4. The semiconductor device of claim 1, wherein the first bonding portion has a width that is wider than a width of the second through portion.

5. The semiconductor device of claim 1, wherein the first cell array is formed on a front surface of the first semiconductor substrate, and the first bonding portion is exposed to an exterior of the first chip through a rear surface of the first semiconductor substrate.

6. The semiconductor device of claim 1, wherein the first semiconductor substrate is positioned between the first cell array and the second cell array.

7. The semiconductor device of claim 1, wherein the second metal wire is positioned between the first semiconductor substrate and the second semiconductor substrate.

8. The semiconductor device of claim 1, wherein the second chip further includes an interlayer insulating film covering the second metal wire, wherein the first semiconductor substrate includes a front surface on which the first cell array is formed, wherein the first semiconductor substrate includes a rear surface being on an opposite side of the front surface, and wherein the interlayer insulating film and the rear surface of the first semiconductor substrate are bonded to each other.

9. The semiconductor device of claim 1, wherein the first chip further includes a first peripheral circuit.

10. The semiconductor device of claim 1, wherein the first cell array includes a memory string.

11. The semiconductor device of claim 1, wherein the first bonding portion of the first chip directly contacts the second through portion of the second chip.

12. The semiconductor device of claim 1, wherein the first through portion is coupled to the first bonding portion as a single film.

13. A semiconductor device comprising:
a first chip including a first substrate, a first metal wire, a first bonding structure, and a first interlayer insulating film, wherein the first metal wire and the first interlayer insulating film are formed on a front surface of the first substrate, and the first bonding structure includes a first through portion that passes through the first metal wire and a first bonding portion that is formed in the first substrate and exposed to an exterior of the first chip through a rear surface of the first substrate; and a second chip, bonded to the first chip, including a second substrate, a second metal wire, a second bonding structure, and a second interlayer insulating film, wherein the second metal wire and the second interlayer insulating film are formed on a front surface of the second substrate, and the second bonding structure includes a second through portion that passes through the second metal wire and a second bonding portion that is formed in the second substrate and exposed to an exterior of the second chip through a rear surface of the second substrate, wherein the rear surface of the first substrate and the second interlayer insulating film are bonded to each other at a bonding interface between the first chip and the second chip, and the first bonding portion is directly bonded to the second through portion.

14. The semiconductor device of claim 13, wherein the first bonding portion has a width that is wider than a width of the first through portion, and wherein the second bonding portion has a width that is wider than a width of the second through portion.

15. The semiconductor device of claim 13, wherein the first bonding portion has a rounded sidewall.

16. The semiconductor device of claim 13, wherein the first bonding structure and the second bonding structure include a conductive material.

17. The semiconductor device of claim 13, wherein the first substrate is a semiconductor substrate.

18. The semiconductor device of claim 13, wherein the first through portion is coupled to the first bonding portion as a single film.

19. A semiconductor device comprising:
a first chip including a first substrate, a first cell array, a first interlayer insulating film, and a first bonding structure, wherein the first bonding structure includes a first bonding portion formed in the first substrate and a first through portion passing through the first interlayer insulating film and coupled to the first bonding portion as a single layer; and a second chip, bonded to the first chip, including a second substrate, a second cell array, a second interlayer insulating film, and a second bonding structure, wherein the second bonding structure includes a second bonding portion formed in the second substrate and a second through portion passing through the second interlayer insulating film and coupled to the second bonding portion as a single layer, wherein the first bonding portion of the first chip is bonded to the second through portion of the second chip.

20. The semiconductor device of claim 19, wherein the first bonding portion directly contacts the second through portion at a bonding interface between the first chip and the second chip.

* * * * *